United States Patent
Su et al.

(10) Patent No.: US 10,602,634 B2
(45) Date of Patent: Mar. 24, 2020

(54) CARD MODULE WITH MULTIPLE CONNECTOR INTERFACES

(71) Applicant: HEWLETT PACKARD ENTERPRISE DEVELOPMENT LP, Houston, TX (US)

(72) Inventors: KaiChun Su, Taipei (TW); Yuan-Hung Wang, Taipei (TW); Kent Liu, Taipei (TW); Ting Wen Tsai, Taipei (TW); Hung-Chu Lee, Taipei (TW); Wei Ying Chiang, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/885,580

(22) Filed: Jan. 31, 2018

(65) Prior Publication Data

US 2019/0239376 A1    Aug. 1, 2019

(51) Int. Cl.
  *H05K 7/10*  (2006.01)
  *H01R 12/73*  (2011.01)
  *H05K 7/14*  (2006.01)
  *H01R 13/64*  (2006.01)

(52) U.S. Cl.
  CPC ............ *H05K 7/10* (2013.01); *H01R 12/737* (2013.01); *H05K 7/1417* (2013.01); *H01R 13/64* (2013.01); *H01R 2201/04* (2013.01); *H01R 2201/06* (2013.01)

(58) Field of Classification Search
  CPC ....... H05K 7/10; H05K 7/1417; H01R 12/737
  USPC ........................................................ 361/728
  See application file for complete search history.

(56) References Cited

U.S. PATENT DOCUMENTS

| | | | |
|---|---|---|---|
| 8,553,578 B2 | 10/2013 | Alshinnawi et al. | |
| 9,280,504 B2 | 3/2016 | Ben-Michael et al. | |
| 10,082,842 B1* | 9/2018 | Looi | H05K 1/0215 |
| 2015/0254201 A1 | 9/2015 | Billi | |
| 2015/0323754 A1* | 11/2015 | Leigh | G02B 6/43 |
| | | | 385/14 |
| 2016/0134363 A1* | 5/2016 | Buckland | H04B 10/038 |
| | | | 398/5 |
| 2016/0140075 A1* | 5/2016 | Kashyap | G06F 13/4265 |
| | | | 710/104 |
| 2016/0270245 A1* | 9/2016 | Linderman | H05K 5/0026 |

OTHER PUBLICATIONS

1 Port PCI Express PCIe Gigabit Network Server Adapter NIC Card—Dual Profile, 3 pages.
Hernandez, R. et al., Dell PowerEdge Select Network Adapters—The Freedom to Choose, Jan. 2012, 19 pages.

* cited by examiner

*Primary Examiner* — Rockshana D Chowdhury
(74) *Attorney, Agent, or Firm* — Nolte Intellectual Property Law Group

(57) ABSTRACT

A card module includes a transceiver, multiple connector interfaces that are each matable with a system connector of a respective type, a detection mechanism and a switching component. The detection mechanism can detect any one of the multiple connector interfaces being mated with the system connector of the respective type. Based on the respective type of the mated system connector, the switching component implements a switch state to connected the mated system connector to the transceiver.

16 Claims, 4 Drawing Sheets

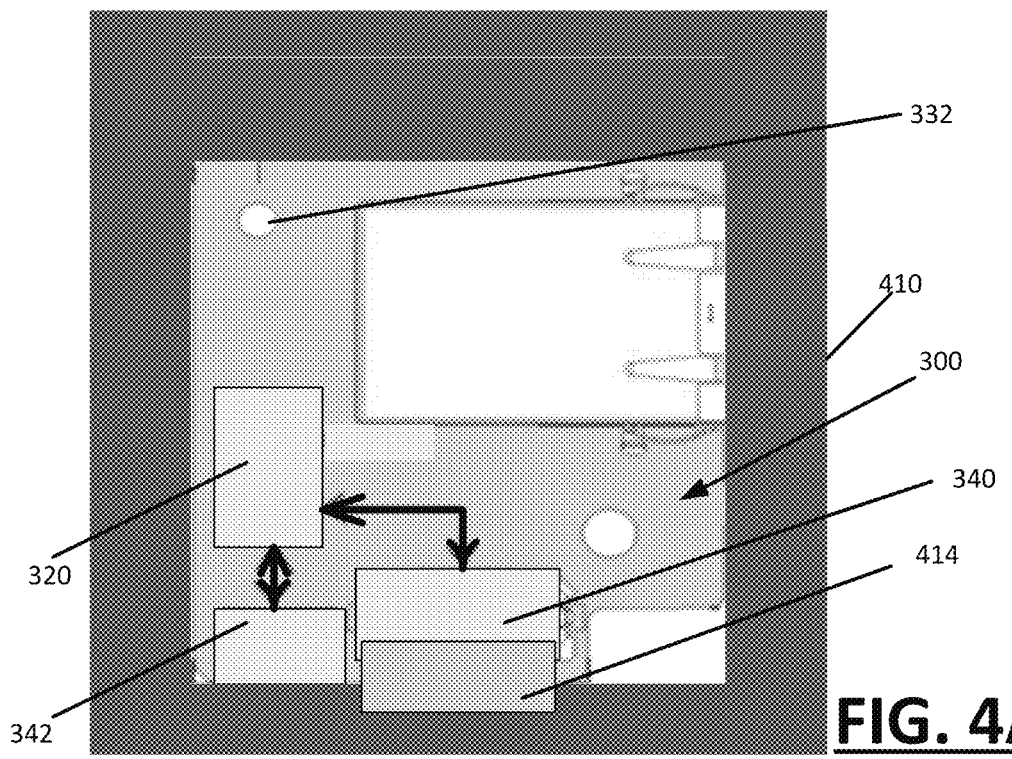
FIG. 4A
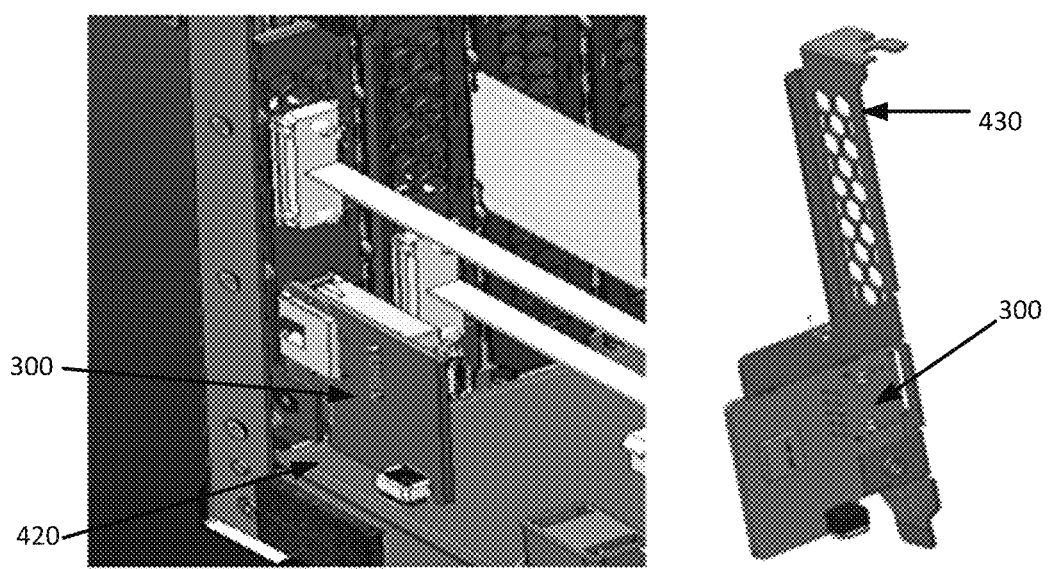
FIG. 4B     FIG. 4C

CARD MODULE WITH MULTIPLE CONNECTOR INTERFACES

BACKGROUND

Card modules provide additional functionality and resources to computer systems. System administrators, for example, use card modules to update servers that operate on an enterprise network. In such cases, card modules can provide, for example, added functionality to a connected server.

BRIEF DESCRIPTION OF THE DRAWINGS

FIG. 4A through FIG. 4C illustrate an example NIC module of FIG. 3, mounted to alternative computer systems.

DETAILED DESCRIPTION

Examples provide for a card module, such as a network interface controller (NIC) module, that is capable of mating with multiple types of system connectors (e.g., motherboard connectors). As described, an example card module includes multiple connector interfaces, which enables the card module to mate with system connectors (e.g., motherboard connectors) of different types. The use of multiple connector interfaces enables the card module to accommodate computer systems (e.g., servers) of different form-factors, as the type of system connector a computer system employs is often based on the computer system's form factor.

In an example, a card module includes multiple connector interfaces, with each connector interface being matable with a system connector of a respective type. The card module includes a detection mechanism that detects when either of the multiple connector interfaces are mated with a system connector of the respective type. The card module can also include a switching component that implements a switch state, where the switch state is determined by the connector interface that is used to mate with the system connector. The switching component implements the switch state to connect a transceiver of the card module to the mated system connector.

In variations, the card module corresponds to a network interface card module, having, for example, a first connector interface for mating with a mezzanine type connector of a first type of computer system, and a second connector interface for mating with a vertical type connector of a second type of computer system. In such examples, the first and second types of computer systems may vary by form factor, as well as by the type of system connectors provided with each of the respective types of computer systems.

Figure 1:
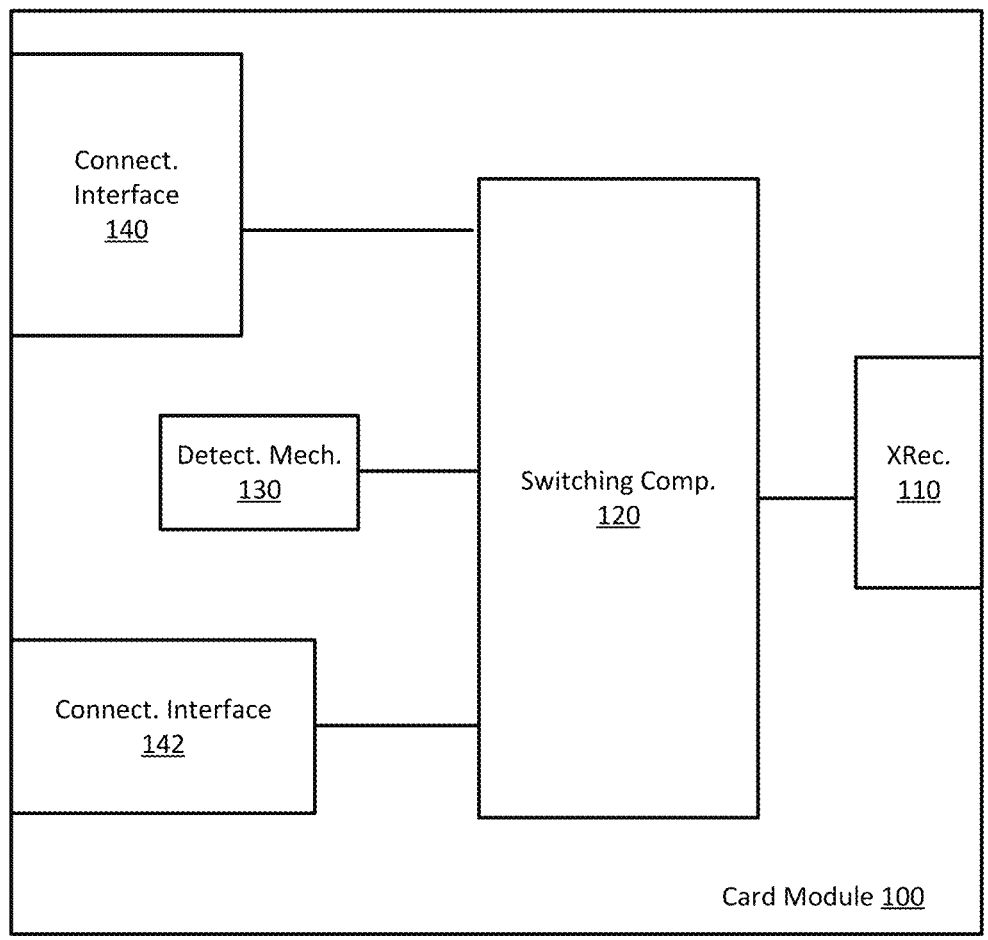
FIG. 1 illustrates an example card module having multiple connector interfaces.

FIG. 1 illustrates an example card module having multiple connector interfaces. In an example of FIG. 1, a card module 100 can be implemented as a hardware package that augments, or otherwise extends functionality of a host computer system. By way of example, the card module 100 can correspond to a network interface controller (NIC) module that provides server security management capabilities to a host computer system. In examples, the card module 100 is capable of mating with multiple types of host system connectors. In particular, the card module 100 is capable of mating with multiple types of system connectors (e.g., connectors mounted on motherboards, or motherboard connectors).

An example of FIG. 1 recognizes that the type of system connectors which computer systems (e.g., servers) utilize is based on form factor considerations. In the case of servers, for example, a rack and tower form factor may utilize a mezzanine type system connector, while a more compact server form factor may utilize a vertical system connector. Card modules are an important tool for managing and operating many types of computer systems, such as servers. Under conventional approaches, card modules are manufactured for specific types of system connectors, and manufacturers provide alternative variations of a given card module design to accommodate different computer system form factors. While a given card module design can be manufactured separately for specific types of system connectors (and thus different computer system form factors), examples recognize that inefficiencies exist (e.g., manufacturing redundancy) with respect to manufacturing separate card modules for different form factors and/or system connectors.

With further reference to an example of FIG. 1, the card module 100 includes a transceiver 110, a switching component 120, a detection mechanism 130, and multiple types of connector interfaces 140, 142. The card module 100 can use the connector interfaces 140, 142 to connect to multiple types of system connectors, to connect the system computer to the transceiver 110. According to examples, the transceiver 110 can provide a communication port or other interface to a physical communication medium (e.g., optical cable, ethernet line, etc.). The transceiver 110 can connect to the switching component 120 using a set of signal lines.

The switching component 120 implements a switch state that connects one of the connector interfaces 140, 142 that is mated with a corresponding system connector to the transceiver 110. With each switch state, the switching component 120 can, for example, map the line definition of a corresponding connector interface 140, 142 to a common signal line definition used with signal lines that extend to the transceiver 110. Depending on implementation, the switching component 120 can be implemented as a multiplexer that can implement two or more switch states. In an example of FIG. 1, the card module 100 includes two connector interfaces 140, 142, with each connector interface 140, 142 being matable to a corresponding type of system connector, and the switching component 120 being configured to implement either of two switch states to accommodate either of the connector interfaces 140, 142. In variations, the card module 100 can include three or more connector interfaces 140, 142, with each connector interface being matable to a corresponding type of system connector, and the switching component 120 being configured to implement any one of three or more switching states to connect either of the connector interfaces that are mated with a respective type of system connector.

In some examples, the switch state that the switching component 120 implements is determined by a value of an input signal provided by the detection mechanism 130. The detection mechanism 130 can be implemented as a circuit element which generates a signal variation as a result of a specific type of connection being made with a particular system connector. For example, the detection mechanism 130 can correspond to a circuit element (e.g., voltage divider) that can detect when the card module 100 is physically connected to a housing or environment of a motherboard that uses a type of system connector that mates with one of the connector interfaces 140, 142.

In examples in which the card module 100 provides for two connector interfaces, the input signal for the switching component 120 can be binary (e.g., high/low), and the detection mechanism 130 can be implemented as a circuit element that generates a signal variation that changes the default value of the input signal when a connection is detected with a system connector for one of the two types of connector interfaces 140, 142. Thus, when a physical connection is made to a system connector or environment (e.g., motherboard package) that triggers the detection mechanism 130 to alter the value of the input signal, the switching component 120 responds by implementing a switch state that connects the connector interface 140, 142 for the detected type of system connector to the transceiver 110. Otherwise, the switching component 120 can implement the default switch state, which connects the other connector interface 140, 142 to the transceiver 110.

In variations in which three or more types of connector interfaces 140, 142 are provided with the card module 100, the switching component 120 and the detection mechanism 130 can be configured to detect and respond to a physical connection or environment for each respective type of system connector. In this way, the detection mechanism 130 can be implemented as a hardware mechanism. In other variations, the switching component 120 and/or detection mechanism 130 can use electrical input from a mated system connector to detect which of the connector interfaces 140, 142 are connected to a corresponding type of system connector.

Figure 2:
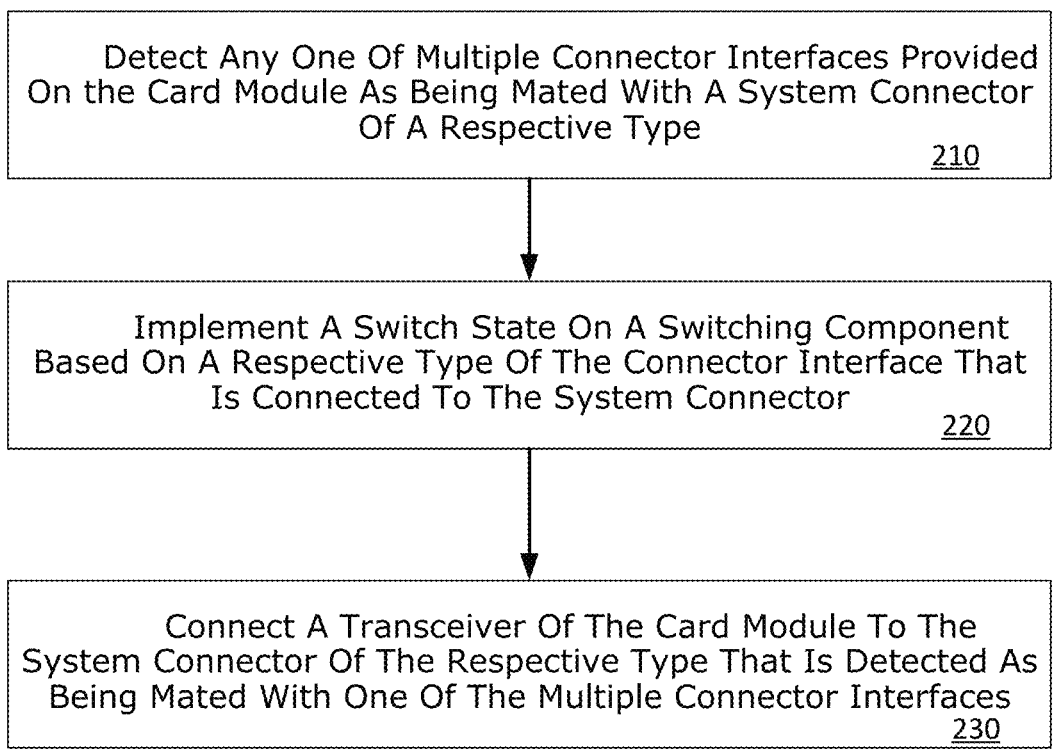
FIG. 2 illustrates an example method for connecting a card module to a system computer.

FIG. 2 illustrates an example method for connecting a card module to a system computer. In particular, an example of FIG. 2 illustrates implementation of a card module to connect with any one of multiple types of system connectors, such as provided with computer systems that utilize different form factors. In describing an example of FIG. 2, reference may be made to elements of FIG. 1 for purpose of illustrating suitable components for performing a step of sub-step being described.

In an example, the card module 100 can detect any one of multiple connector interfaces provided on the card module, as being used with a system connector of a respective type (210). For example, the detection mechanism 130 can detect when the card module 100 is physically connected to the housing or package of a motherboard or computer system that utilizes a particular type of connector interface. In variations, the detection mechanism 130 can detect when one of the connector interfaces 140, 142 is mated with a corresponding type of system connector. For example, the detection mechanism 130 can detect a signal pattern or characteristic of when a system connector of a particular type is mated with a respective one of the connector interfaces 140, 142.

In examples, the card module 100 can implement a switch state based on a respective type of the connector interface that is connected to the system connector (220). The switching component 120 can implement a switch state that is specific to the connector interface 140, 142 that is mated or otherwise to be connected to a corresponding system connector. The determination of the switch state can be based on an input signal provided by a detection mechanism, as a response to a mechanical and/or electrical connection of the card module 100 to a computer system, environment or system connector of a particular type.

The card module 100 can connect the detection mechanism 130 to the system connector of the respective type that is detected as being mated with one of the multiple connector interfaces (230). In examples, the switching component 120 can implement a switch state that maps signal lines of the mated connector interface 140, 142 to signal lines that extend to the detection mechanism 130.

Figure 3:
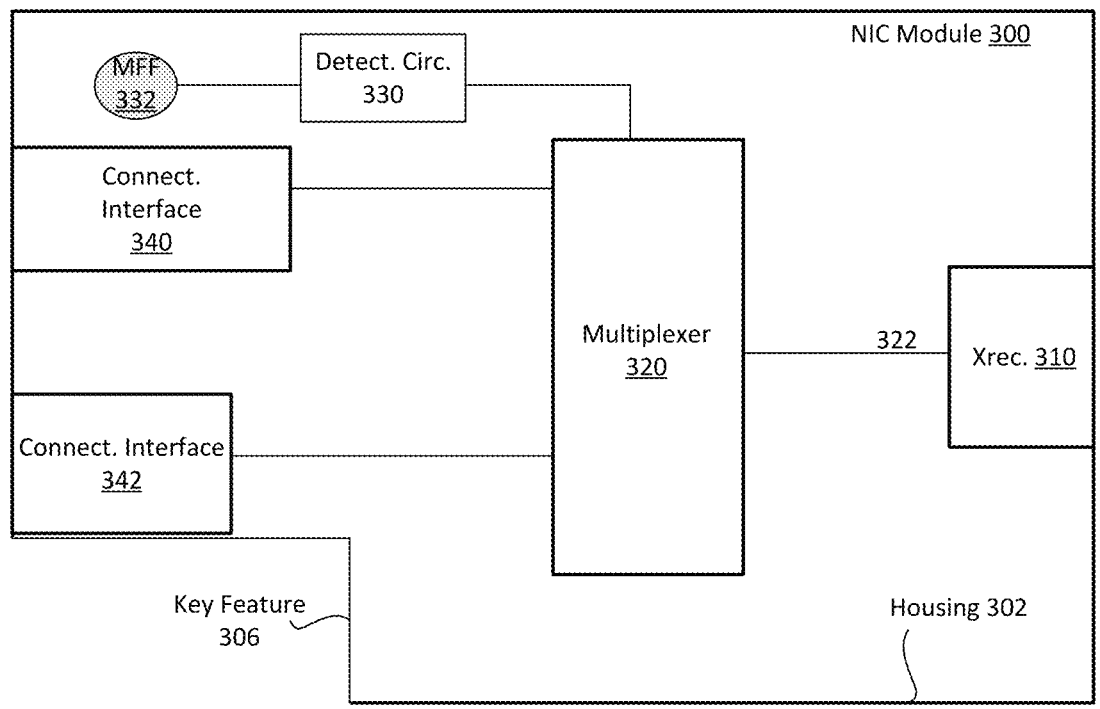
FIG. 3 illustrates an example network interface card (NIC) module that can mate with multiple types of motherboard connectors.

FIG. 3 illustrates an example card module that can mate with multiple types of motherboard connectors. In an example, the NIC module 300 can correspond to a network interface card (NIC) module includes a housing 302 having a base on which a set of network resources is provided. In some examples, the set of network resources include hardware components for receiving/transmitting network communications, using a specific type of physical communication medium (e.g., optical fiber, data line, etc.). The housing 302 can support a transceiver 310, a multiplexer 320, a detection circuit 330, a first connector interface 340, and a second connector interface 342. The NIC module 300 can provide hardware resources that extend network communication functionality to a connected computer. By way of example, the transceiver 310 can include an interface to a physical communication layer, such as provided by an optical cable or data transmission line. The NIC module 300 can further include resources to manage incoming and outgoing communications through the transceiver 310. In some examples, the NIC module 300 can be connected to a computer system, using one of the 340, 342 and a mated motherboard connector, in order to enable the computer system to receive and/or transmit communications via the NIC module 300.

In an example, the multiplexer 320 uses the detection circuit 330 to set the switch state. Depending on the switch state, the multiplexer 320 maps or otherwise connects the signal lines extending from one of the connector interfaces 340, 342 to signal lines 322 that extend to the detection circuit 330. In a default switching state, the multiplexer 320 connects the signal lines of one of the connector interfaces to the transceiver 310. The switch state of the multiplexer 320 can be determined by the signal line value (e.g., high or low) provided by the detection circuit 330. In some examples, the detection circuit 330 can be connected to a mechanical fastening feature 332, which can cause a signal variation (e.g., from high to low, or low to high). By way of example, the mechanical fastening feature 332 can correspond to an aperture provided on the base of the housing 302. The mechanical fastening feature 332 can receive, for example, an insertive mechanical fastener, such as a screw. In this way, the mechanical fastening feature 332 can be used to mechanically couple the NIC module 300 to a motherboard with connectors of a type that mate with the first connector interface. The detection circuit 330 can be connected to the mechanical fastening feature 332 to generate the signal variation, coinciding with, for example, the aperture receiving the insertive fastener when the NIC module 300 is coupled to a server which utilizes a motherboard with mezzanine connectors. Absent the variation which may be generated by the mechanical fastening feature 332, the multiplexer 320 can implement a default or alternative switch state that connects the signal lines of the other connector interface to the transceiver 310.

In an example, the NIC module 300 can be supported planarly (or flat) on the base of the housing 302 to mate with a first type of system connector (e.g., mezzanine type connector). Additionally, the NIC module 300 can be supported vertically, or edge wise, in order to connect to a second type of connector. Still further, in some variations, the housing 302 may include a key feature 306 that enables the NIC module 300 to be supported in alternative positions, while connected to a computer system using one of the connector interfaces 340, 342.

FIG. 4A illustrates NIC module 300 mounted in the planarly configuration, to mate with a motherboard connector of a computer system 410 (e.g., rack and tower server) that supports, for example, a mezzanine connector 414. In an example of FIG. 4A, the mezzanine connector 414 is mated with respective connector interface 340 of the NIC module 300. The NIC module 300 can utilize, for example, the mechanical fastening feature 332 to trigger a signal variation to the multiplexer 320 via the detection circuit 330 (see FIG. 3).

FIG. 4B illustrates the NIC module 300 mounted in a vertical position, to mate with a motherboard connector of a computer system 420 with a relatively small form factor. When mounted in the vertical configuration, the NIC module 300 uses the vertical (or right-angle) connector interface 342 to mate with the motherboard connector of the computer system 420.

FIG. 4C illustrates the NIC module 300 mounted to a bracket 430, using the housing key feature 306 (see FIG. 3). With the bracket, the NIC module 300 can be mated vertically with other types of computer systems which utilize vertical or right angle connectors.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. Thus, the absence of describing combinations should not preclude the inventor from claiming rights to such combinations.

What is claimed is:

1. A card module comprising:
   a transceiver;
   multiple connector interfaces of different types, each of the multiple connector interfaces being matable with a system connector of a respective type, the multiple connector interfaces of different types including a mezzanine connector interface being planarly matable with a first system connector of a first type and a vertical connector interface being vertically matable with a second system connector of a second type;
   a detection mechanism to detect any one of the multiple connector interfaces being mated with the system connector of the respective type; and
   a switching component that implements a switch state, based on a type of the one of the multiple connector interfaces that is connected to the system connector of the respective type, to connect the transceiver to the system connector of the respective type that is detected as being mated with the one of the multiple connector interfaces.

2. The card module of claim 1, further comprising a housing having a mechanical fastening feature to attach the card module to a computer system.

3. The card module of claim 2, wherein the detection mechanism includes a circuit element that is connected to the system connector of the respective type that is detected as being mated with one of the multiple connector interfaces.

4. The card module of claim 3, wherein the circuit element is a voltage divider.

5. The card module of claim 3, wherein the circuit element provides one of a high or low voltage signal based on whether the mechanical fastening feature is used to attach the housing to the computer system.

6. The card module of claim 4, wherein the mechanical fastening feature is an aperture to receive a threaded fastener.

7. The card module of claim 2, wherein the housing is dimensioned to (i) attach planarly to a first computer system to mate the mezzanine connector interface of the multiple connector interfaces to the first system connector of the first type, and (ii) attach edgewise to a second computer system to mate the vertical connector interface of the multiple connector interfaces to the second system connector of the second type.

8. The card module of claim 2, wherein the housing includes a key feature to externally couple to the first system connector.

9. The card module of claim 1, wherein the switching component is a multiplexer.

10. A network interface card module comprising:
    a housing to retain a network interface resource;
    a transceiver;
    multiple connector interfaces of different types, each of the multiple connector interfaces being matable with a system connector of a respective type, the multiple connector interfaces of different types including a mezzanine connector interface that is planarly matable with a first system connector of a first type and a vertical connector interface that is vertically matable with a second system connector of a second type;
    a detection circuit to detect the housing mounted to a computer system in which one of the multiple connector interfaces is mated with the system connector of the respective type; and
    a switching component that implements a switch state, based on a type of the one of the multiple connector interfaces that is connected to the system connector of the respective type, to connect the transceiver to the system connector of the respective type that is detected as being mated with the one of the multiple connector interfaces.

11. The network interface card module of claim 10, wherein the housing is dimensioned to (i) attach planarly to a first computer system to mate the mezzanine connector interface of the multiple connector interfaces to the first system connector of the first type, and (ii) attach edgewise to a second computer system to mate the vertical connector interface of the multiple connector interfaces to the second system connector of the second type.

12. The network interface card module of claim 10, wherein the housing includes a key feature to externally couple to the first system connector.

13. The network interface card module of claim 10, wherein the switching component is a multiplexer.

14. The network interface card module of claim 10, wherein the detection circuit includes a voltage divider that is connected to a mechanical fastening feature of the card module, to respond to a mechanical coupling being formed using the mechanical fastening feature.

15. The card module of claim 2, wherein the housing includes a key feature to externally couple to the second system connector.

16. The network interface card module of claim 10, wherein the housing includes a key feature to externally couple to the second system connector.

* * * * *